United States Patent
Mendel et al.

(10) Patent No.: US 10,241,844 B2
(45) Date of Patent: Mar. 26, 2019

(54) TECHNIQUES FOR HEAT SPREADING IN AN INTEGRATED CIRCUIT

(71) Applicant: Intel Corporation, Santa Clara, CA (US)

(72) Inventors: David Mendel, Sunnyvale, CA (US); Rajiv Kane, Fremont, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/592,806

(22) Filed: May 11, 2017

(65) Prior Publication Data

US 2018/0329759 A1   Nov. 15, 2018

(51) Int. Cl.
| | | |
|---|---|---|
| *G06F 11/30* | (2006.01) | |
| *G06F 9/50* | (2006.01) | |
| *H01L 23/367* | (2006.01) | |
| *G06F 13/40* | (2006.01) | |
| *G06F 1/3287* | (2019.01) | |
| *G06F 1/20* | (2006.01) | |
| *G06F 11/10* | (2006.01) | |

(52) U.S. Cl.
CPC ............ *G06F 9/5094* (2013.01); *G06F 1/206* (2013.01); *G06F 1/3287* (2013.01); *G06F 11/1008* (2013.01); *G06F 13/4022* (2013.01); *H01L 23/367* (2013.01)

(58) Field of Classification Search
None
See application file for complete search history.

(56) References Cited

U.S. PATENT DOCUMENTS

| | | | | |
|---|---|---|---|---|
| 5,884,220 A | * | 3/1999 | Farmer | G01S 19/41 342/357.44 |
| 7,992,151 B2 | | 8/2011 | Warrier et al. | |
| 9,237,047 B1 | * | 1/2016 | Zhang | H04L 25/061 |
| 2005/0226352 A1 | * | 10/2005 | Kasperkovitz | H03D 3/009 375/346 |
| 2008/0295134 A1 | * | 11/2008 | Taga | H04H 40/27 725/56 |
| 2010/0046627 A1 | * | 2/2010 | Xiao | H03M 7/425 375/240.23 |
| 2017/0125383 A1 | * | 5/2017 | Liu | H01L 25/0657 |
| 2018/0152236 A1 | * | 5/2018 | Maniloff | H04B 10/032 |

* cited by examiner

*Primary Examiner* — Mujtaba M Chaudry
(74) *Attorney, Agent, or Firm* — Steven J. Cahill

(57) ABSTRACT

First and second circuits in an integrated circuit that generate local hot spots are activated at different times in order to reduce heat generation within each of the first and second circuits. The first and second circuits in the integrated circuit have the same circuit architecture. The first circuit processes data during a first time period, and heat generation is reduced in the second circuit during the first time period. A data path of the data is then switched from the first circuit to the second circuit. The second circuit then processes the data during a second time period after the first time period, and heat generation is reduced in the first circuit during the second time period. The data path of the data is then switched from the second circuit back to the first circuit. The first circuit then processes the data again.

20 Claims, 5 Drawing Sheets

US 10,241,844 B2

TECHNIQUES FOR HEAT SPREADING IN AN INTEGRATED CIRCUIT

FIELD OF THE DISCLOSURE

The present disclosure relates to electronic circuits, and more particularly, to techniques for heat spreading to achieve thermal mitigation in an integrated circuit.

BACKGROUND

Excessive temperatures within an integrated circuit may adversely affect the performance of the integrated circuit or cause permanent degradation of the integrated circuit. For example, as temperatures within an integrated circuit rise, the frequency at which circuit components within the integrated circuit operate may decrease. As another example, a local increase in temperature in an integrated circuit may cause a reduced lifetime due to faster electro-migration or failure by melting or changing the structure of layers or components within the integrated circuit.

DETAILED DESCRIPTION

Areas of increased localized power generation within an integrated circuit (IC) can create challenging thermal solutions. As an example, an area within an integrated circuit that generates greater than 400 milliwatts per square millimeter (mW/mm$^2$) of power will create a localized hot spot that is more difficult to maintain below a required operating temperature (e.g., below 100° C.) than areas within the IC that generate 250 mW/mm$^2$. Logic circuitry within an integrated circuit that performs error correction using 16 nanometer FinFET transistors at 30 gigabits per second (Gbps) may, for example, have a thermal density greater than 500 mW/mm$^2$. Even if the rest of the integrated circuit is generating power at 250 mW/mm$^2$, a local area within the integrated circuit may be hotter, thus requiring a more aggressive cooling solution for that local area. Local areas of increased power generation within an integrated circuit may generate even more heat in an integrated circuit package having an interposer (often referred to as a 2.5 D package). 2.5 D packages often have less thermal conductivity to the rest of the silicon in the package, and yet these packages often contain power intensive circuits.

According to some embodiments disclosed herein, regions of circuitry within an integrated circuit that generate local hot spots are dynamically activated at different times in order to reduce heat generation within each of the regions of circuitry. A local hot spot is a region within an integrated circuit (IC) that is hotter than other regions within the IC. The regions of circuitry within the integrated circuit may contain identical or similar copies of the same circuit design. As an example, a transceiver circuit within an IC may include multiple parallel data processing lanes that each have the same circuit design. Each of the lanes in the transceiver circuit includes a transmitter that transmits data signals and/or a receiver that receives data signals. Each of the lanes may include digital logic circuitry that, for example, performs forward error correction on the transmitted and/or received data. The logic circuitry within each of the lanes may generate a significant amount of heat when the logic circuitry is being used to perform forward error correction. If one of the lanes in the transceiver is not being used for a period of time, two or more of the lanes can be activated at different times to transmit or receive the same data signal in order to reduce heat generation within each of the lanes. Further objects, features, and advantages of this embodiment and additional embodiments are described below and shown in the figures.

Figure 1:
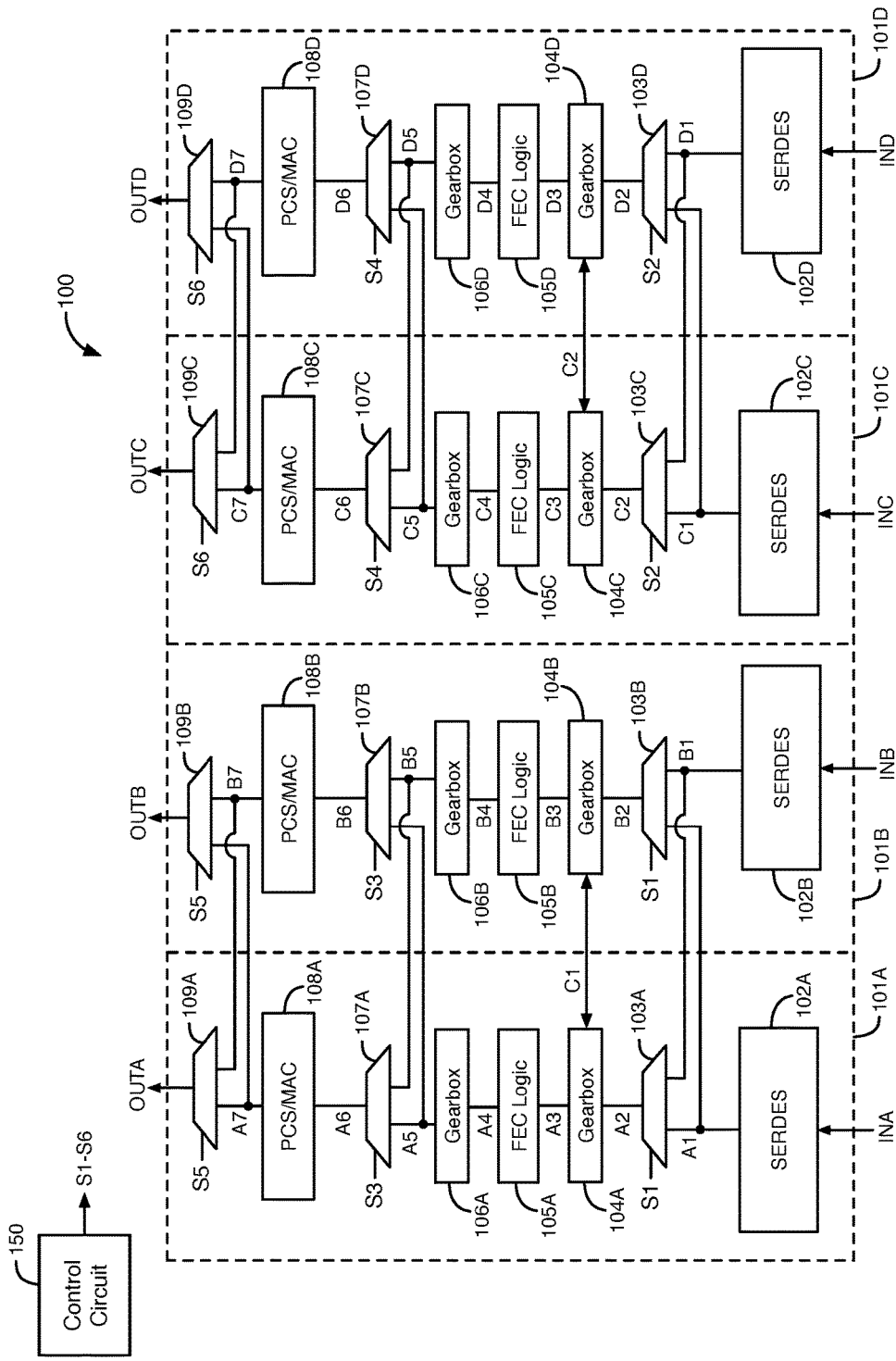
FIG. 1 illustrates an example of circuitry that performs dynamic switching to achieve thermal mitigation for local hot spots within receiver circuits in a transceiver circuit, according to an embodiment.

FIG. 1 illustrates an example of circuitry that performs dynamic switching to achieve thermal mitigation for local hot spots in a transceiver circuit 100, according to an embodiment. FIG. 1 shows transceiver circuit 100 and a control circuit 150. The transceiver circuit 100 and the control circuit 150 are in an integrated circuit die. Transceiver circuit 100 includes four parallel lanes 101A, 101B, 101C, and 101D. Each of the lanes 101A-101D includes a receiver circuit that processes data received from an external device. Each of the lanes may also include a transmitter circuit that processes data for transmission to an external device. Each of the lanes 101A-101D has the same circuit architecture. The one or more external devices that transmit data to and/or receive data from transceiver circuit 100 are not in the same integrated circuit as transceiver circuit 100.

The receiver circuit in each of the lanes 101A-101D includes a serializer/deserializer (SERDES) circuit 102, a multiplexer circuit 103, a gearbox circuit 104, a forward error correction (FEC) logic circuit 105, a gearbox circuit 106, a multiplexer circuit 107, a PCS/MAC circuit 108, and a multiplexer circuit 109. Lanes 101A-101D include SERDES circuits 102A-102D, multiplexer circuits 103A-103D, gearbox circuits 104A-104D, FEC logic circuits 105A-105D, gearbox circuits 106A-106D, multiplexer circuits 107A-107D, PCS/MAC circuits 108A-108D, and multiplexer circuits 109A-109D, respectively.

In normal receiver operation, each of the four lanes 101A-101D may be used to process data received from one or more external devices. During normal receiver operation, lanes 101A, 101B, 101C, and 101D process data received in input data signals INA, INB, INC, and IND to generate output data signals OUTA, OUTB, OUTC, and OUTD, respectively. During normal receiver operation, SERDES circuits 102A-102D receive data in input data signals INA, INB, INC, and IND, respectively. Each of input data signals INA, INB, INC, and IND may be, for example, a single serial signal or multiple parallel signals.

If each of input data signals INA-IND is a serial signal, deserializer circuits in SERDES circuits 102A, 102B, 102C, and 102D convert the serial data indicated by signals INA, INB, INC, and IND from serial to parallel to generate parallel data signals A1, B1, C1, and D1, respectively. If each of the four input data signals INA-IND includes multiple parallel data signals, serializer circuits in SERDES circuits 102A, 102B, 102C, and 102D may convert the parallel data indicated by signals INA, INB, INC, and IND into serial data signals A1, B1, C1, and D1, respectively. Data signals A1, B1, C1, and D1 are provided to the first multiplexing inputs of multiplexer circuits 103A, 103B, 103C, and 103D, respectively, as shown in FIG. 1. Data signals B1, A1, D1, and C1 are also provided to the second multiplexing inputs of multiplexer circuits 103A, 103B, 103C, and 103D, respectively.

Control circuit 150 generates 6 select signals S1, S2, S3, S4, S5, and S6. Select signal S1 is provided to a select input of each of multiplexer circuits 103A and 103B. Select signal S2 is provided to a select input of each of multiplexer circuits 103C and 103D. If each of the data signals A1, B1, C1, and D1 includes multiple parallel data signals, then each of the multiplexer circuits 103A-103D may include multiple 2-to-1 multiplexer circuits, each of which receives two data signals from two of the SERDES circuits 102. Control circuit 150 may include, for example, a state machine.

During the normal receiver operation, control circuit 150 sets select signals S1-S2 to logic states that cause multiplexer circuits 103A-103D to provide the data indicated by data signals A1, B1, C1, and D1 to their outputs as data signals A2, B2, C2, and D2, respectively. Signals A2, B2, C2, and D2 are provided to inputs of gearbox circuits 104A, 104B, 104C, and 104D, respectively. Gearbox circuits 104A, 104B, 104C, and 104D provide the data indicated by data signals A2, B2, C2, and D2 to output data signals A3, B3, C3, and D3, respectively.

If the input data signals INA-IND are serial data signals, gearbox circuits 104A, 104B, 104C, and 104D may, for example, function as word aligners that align data words in data signals A2, B2, C2, and D2 to generate aligned data words in output data signals A3, B3, C3, and D3, respectively. Gearbox circuits 104A, 104B, 104C, and 104D may, for example, determine the location of the first bit in each data word in signals A2, B2, C2, and D2, and then shift the first bit in each data word in signals A2, B2, C2, and D2 to a predetermined bit location in signals A3, B3, C3, and D3, respectively. Gearbox circuits 104A, 104B, 104C, and 104D may also change the word size of the data to cause data signals A3, B3, C3, and D3 to have different word sizes than data signals A2, B2, C2, and D2, respectively.

Data signals A3, B3, C3, and D3 are provided to inputs of FEC logic circuits 105A, 105B, 105C, and 105D, respectively. FEC logic circuits 105A, 105B, 105C, and 105D perform error detection and error correction functions on the data indicated by data signals A3, B3, C3, and D3 to generate error corrected data in output data signals A4, B4, C4, and D4, respectively. FEC logic circuits 105A, 105B, 105C, and 105D may, for example, generate error corrected data in output data signals A4, B4, C4, and D4, respectively, using Reed-Solomon error correction codes, parity check codes, or any other suitable type of error correction codes.

Data signals A4, B4, C4, and D4 are provided to inputs of gearbox circuits 106A, 106B, 106C, and 106D, respectively. Gearbox circuits 106A, 106B, 106C, and 106D provide the data indicated by data signals A4, B4, C4, and D4 to output data signals A5, B5, C5, and D5, respectively. Gearbox circuits 106A, 106B, 106C, and 106D may, for example, change the word size of the data to cause data signals A5, B5, C5, and D5 to have different word sizes than data signals A4, B4, C4, and D4, respectively.

Data signals A5, B5, C5, and D5 are provided to first multiplexing inputs of multiplexer circuits 107A, 107B, 107C, and 107D, respectively. Data signals B5, A5, D5, and C5 are also provided to the second multiplexing inputs of multiplexer circuits 107A, 107B, 107C, and 107D, respectively. Select signal S3 is provided to a select input of each of multiplexer circuits 107A and 107B. Select signal S4 is provided to a select input of each of multiplexer circuits 107C and 107D. If each of the data signals A5, B5, C5, and D5 includes multiple parallel data signals, then each of the multiplexer circuits 107A-107D may include multiple 2-to-1 multiplexer circuits, each of which receives two data signals from two of the gearbox circuits 106.

During the normal receiver operation, control circuit 150 sets select signals S3-S4 to logic states that cause multiplexer circuits 107A-107D to provide the data indicated by data signals A5, B5, C5, and D5 to their outputs as data signals A6, B6, C6, and D6, respectively. Data signals A6, B6, C6, and D6 are provided to inputs of PCS/MAC circuits 108A, 108B, 108C, and 108D, respectively. Control circuit 150 may choose to only change the states of signals S1-S6 at appropriate times, such as at the beginning of a new FEC-block boundary or in-between packets of data feeding circuits 108.

PCS/MAC circuits 108A, 108B, 108C, and 108D contain logic circuits that perform functions related to the Physical Coding Sublayer (PCS) and/or the Media Access Control (MAC) sublayer of an Ethernet networking standard on the data received in data signals A6, B6, C6, and D6 to generate data in data signals A7, B7, C7, and D7, respectively. As examples, circuits 108A-108D may perform PCS functions on the data received in data signals A6-D6 to generate data signals A7-D7, such as data encoding/decoding, scrambling/descrambling, alignment marker insertion/removal, block and symbol redistribution, and/or lane block synchronization and deskew.

Data signals A7, B7, C7, and D7 are provided to first multiplexing inputs of multiplexer circuits 109A, 109B, 109C, and 109D, respectively. Data signals B7, A7, D7, and C7 are also provided to the second multiplexing inputs of multiplexer circuits 109A, 109B, 109C, and 109D, respectively. Select signal S5 is provided to a select input of each of multiplexer circuits 109A and 109B. Select signal S6 is provided to a select input of each of multiplexer circuits 109C and 109D. If each of the data signals A7, B7, C7, and D7 includes multiple parallel data signals, then each of the multiplexer circuits 109A-109D may include multiple 2-to-1 multiplexer circuits, each of which receives two data signals from two of the PCS/MAC circuits 108. During the normal receiver operation, control circuit 150 sets select signals S5-S6 to logic states that cause multiplexer circuits 109A-109D to provide the data indicated by data signals A7, B7, C7, and D7 to their outputs as data signals OUTA, OUTB, OUTC, and OUTD, respectively.

As discussed above, the FEC logic circuits 105A-105D may generate a significant amount of heat when the FEC logic circuits 105A-105D are performing error detection and correction functions on the data indicated by data signals A3, B3, C3, and D3, respectively. According to an embodiment, FEC logic circuits 105A-105D are dynamically activated at different times in order to reduce heat generation within FEC logic circuits 105A-105D during a dynamic switching mode.

In the dynamic switching mode, transceiver circuit 100 receives and processes data from only one of the data signals INA-INB and from only one of the data signals INC-IND. During the dynamic switching mode, the other two of the data signals INA-IND do not contain data. The example described below relates to an embodiment in which transceiver circuit 100 receives data from signals INA and INC, but not from signals INB and IND. However, the techniques disclosed herein also apply to an embodiment in which transceiver circuit 100 receives data from signals INB and IND, but not from signals INA and INC.

The data received from each of the two data signals are dynamically switched between the FEC logic circuits 105 in two adjacent lanes 101 during alternating periods of time in the dynamic switching mode, as described below. The alternating periods of time are referred to below as the first and second periods of time. Each of the second periods of time is interleaved between two of the first periods of time, such that the first and second periods of time occur in the following order: first period, second period, first period, second period, first period, second period, etc.

During each first period of time, the data received from input data signal INA is processed by circuits 102A, 103A, 104A, 105A, 106A, 107A, 108A, and 109A, and the data received from input data signal INC is processed by circuits 102C, 103C, 104C, 105C, 106C, 107C, 108C, and 109C, as described above. Thus, during each first period of time, FEC circuits 105A and 105C perform error detection and correction functions on the data received from data signals INA and INC, respectively. Also, during each first period of time, FEC circuits 105B and 105D are dormant (e.g., turned off) and do not perform error detection or error correction.

During each second period of time in the dynamic switching mode after one of the first periods of time, the data received from input data signal INA is processed by circuits 102A, 103B, 104B, 105B, 106B, 107A, 108A, and 109A, and the data received from input data signal INC is processed by circuits 102C, 103D, 104D, 105D, 106D, 107C, 108C, and 109C. During each second period of time, control circuit 150 changes the logic states of signals S1 and S2 to cause multiplexer circuits 103B and 103D to route the data indicated by signals A1 and C1 to gearbox circuits 104B and 104D as signals B2 and D2, respectively. Also, during each second period of time, FEC circuits 105B and 105D perform error detection and correction functions on the data received from data signals INA and INC, respectively. FEC circuits 105A and 105C are dormant (e.g., turned off) and do not perform error detection or error correction. Control circuit 150 also changes the logic states of signals S3-S4 to cause multiplexer circuits 107A and 107C to route the data indicated by signals B5 and D5 to PCS/MAC circuits 108A and 108C as signals A6 and C6, respectively.

Control circuit 150 may then continuously toggle the logic states of signals S1-S4 to cause the data indicated by signals INA and INC to be routed through different ones of the FEC logic circuits 105 via multiplexer circuits 103 and 107, as described above, during the alternating first and second periods of time. By dynamically switching between different FEC logic circuits 105 in adjacent lanes to perform the error detection and error correction on the data received from signals INA and INC, heat generation within each of FEC logic circuits 105A-105D may be substantially reduced during the dynamic switching mode. Because each of the FEC logic circuits 105A-105D performs error detection and error correction about half of the total processing time and is dormant the remainder of the time, each of the FEC logic circuits 105A-105D generates significantly less heat. Therefore, local hot spots in transceiver circuit 100 are substantially reduced in this embodiment.

During the dynamic switching mode, the gearbox circuits 104A-104D and 106A-106D may or may not maintain synchronization with the data when they are dormant and not being used to process data from one of the input data signals. In one embodiment, gearbox circuits 104A-104D and 106A-106D always maintain synchronization with the data even when they are dormant and not being used to process data. Dynamic switching is performed between the gearbox and FEC logic circuits in different lanes without needing to wait for each dormant gearbox circuit to re-synchronize with the data. For example, gearbox circuits 104B and 104D may maintain synchronization with the data during each first period of time by receiving synchronization states from gearbox circuits 104A and 104C, respectively. During each first period of time in this embodiment, synchronization states C1 may be transmitted from gearbox circuit 104A to gearbox circuit 104B, and synchronization states C2 may be transmitted from gearbox circuit 104C to gearbox circuit 104D. During each second period of time, synchronization states C1 may be transmitted from gearbox circuit 104B to gearbox circuit 104A, and synchronization states C2 may be transmitted from gearbox circuit 104D to gearbox circuit 104C.

The transmitted synchronization states C1 and C2 may include, for example, data word alignment information indicating the location of the first bit in each data word in the received data. As another example, the transmitted synchronization states C1 and C2 may include frame lock, which indicates when the gearbox circuit detects the start of a frame of data. As other examples, the transmitted synchronization states C1 and C2 may include gearbox states, word-lock status over a running window of data bits, or a running disparity between data word lengths within the gearbox circuits. Synchronization states may also be transmitted between gearbox circuits 106A and 106B and between gearbox circuits 106C and 106D in a similar manner.

Because the synchronization states are transmitted between the gearbox circuits during the dynamic switching mode in this embodiment, the gearbox circuits 104 and 106 do not need to spend time achieving synchronization with the data each time that the multiplexer circuits 103 and 107 switch the data paths of the data between the lanes as described above. As a result, each of the FEC logic circuits 105A-105D may spend more time detecting and correcting errors in data in this embodiment, and less time waiting for the gearbox circuits 104 and 106 to achieve synchronization with the data.

In another embodiment, gearbox circuits 104A-104D and 106A-106D do not maintain synchronization with the data when they are dormant and not being used to process data. Each of the gearbox circuits 104A-104D and 106A-106D is completely off when it is not being used to process data in order to reduce heat generation within that gearbox circuit. In this embodiment, the gearbox circuits 104 and 106 re-synchronize with the data each time that the multiplexer circuits 103 and 107 switch the data paths of the data between the lanes to the respective gearbox circuit, as described above. For example, after multiplexer circuits 103B and 103D cause gearbox circuits 104B and 104D to receive the data from signals INA and INC during each second period of time, gearbox circuits 104B and 104D synchronize with the data received from signals INA and INC, respectively. This synchronization is performed before the FEC logic circuits 105B and 105D can perform error detection and error correction. For example, gearbox circuits 104B and 104D may perform frame lock for data frames in the data received from signals INA and INC, respectively. The synchronization may take multiple frames to achieve frame lock. Thus, more time is used in this embodiment to switch the data paths between the gearbox and FEC logic circuits in different lanes. Also, the gearbox circuits 104 in two adjacent lanes run in parallel for a period of time after one of the gearbox circuits is turned on again, until synchronization with the data is achieved in the gearbox circuit that was just turned on again. After synchronization with the data is achieved, the data path is switched to the newly synchronized lane, and the now dormant gearbox and FEC logic circuits are turned off.

According to another embodiment, PCS/MAC circuits 108A-108D are dynamically activated at different times in order to reduce heat generation and local hot spots within PCS/MAC circuits 108A-108D during a dynamic switching mode. During this dynamic switching mode, transceiver circuit 100 also receives and processes data from only one of the data signals INA-INB and from only one of the data signals INC-IND. The data received from each of the two data signals are dynamically switched between the PCS/MAC circuits 108 in two adjacent lanes 101 during alternating periods of time in the dynamic switching mode, as described below.

In this dynamic switching mode, control circuit 150 toggles signals S3-S6 to cause multiplexer circuits 107A-107D and 109A-109D to switch the two data paths between two of PCS/MAC circuits 108A-108D in alternating periods of time that are referred to as first and second time periods. Control circuit 150 causes the first and second time periods to be repeated in an alternating manner, such that each of the second periods of time is interleaved between two of the first periods of time (i.e., first period, second period, first period, second period, etc.). During each first time period, data received in input data signals INA and INC (or INB and IND) are processed by PCS/MAC circuits 108A and 108C. During each second time period, data received in input data signals INA and INC (or INB and IND) are processed by PCS/MAC circuits 108B and 108D. This embodiment may be used concurrently with or independently of the embodiment that switches between two of the FEC logic circuits 105 as described above.

If the PCS/MAC circuits 108A-108D are switched concurrently with the FEC logic circuits 105A-105D, the two active PCS/MAC circuits 108 may be in the same lane 101 as the two active FEC logic circuits 105 or in different lanes than the two active FEC logic circuits 105. As an example, FEC logic circuit 105A and PCS/MAC circuit 108A may be active during each first time period, and FEC logic circuit 105B and PCS/MAC circuit 108B may be active during each second time period. Alternatively, FEC logic circuit 105A and PCS/MAC circuit 108B may be active during each first time period, and FEC logic circuit 105B and PCS/MAC circuit 108A may be active during each second time period.

Figure 2:
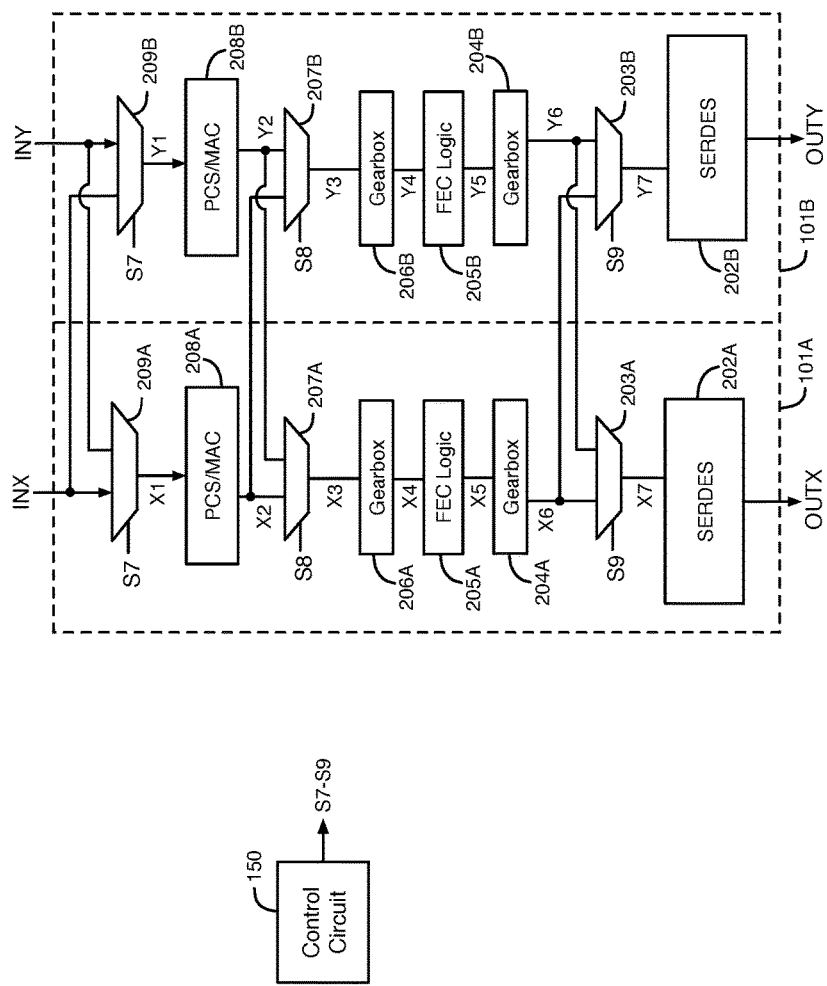
FIG. 2 illustrates an example of dynamic switching to reduce heat generation in transmitter circuits in a transceiver circuit, according to an embodiment.

According to other embodiments, dynamic switching may be applied to portions of transmitter circuits to reduce heat generation and hot spots while the transmitter circuits are transmitting data. FIG. 2 illustrates an example of dynamic switching to reduce heat generation in transmitter circuits in transceiver circuit 100, according to an embodiment. FIG. 2 illustrates two of the lanes 101A-101B in transceiver circuit 100. During normal transmission operation, a transmitter circuit in each of the lanes 101 in transceiver circuit 100 generates an output data signal that indicates data received in a respective input data signal. For example, the transmitter circuits in lanes 101A-101B generate output data signals OUTX and OUTY that indicate data received in input data signals INX and INY, respectively. Data signals OUTX and OUTY are transmitted outside the IC that contains transceiver circuit 100 to an external device.

The transmitter circuit in each lane 101 includes a multiplexer circuit 209, a PCS/MAC circuit 208, a multiplexer circuit 207, a gearbox circuit 206, a FEC logic circuit 205, a gearbox circuit 204, a multiplexer circuit 203, and a SERDES circuit 202. Control circuit 150 generates select signals S7, S8, and S9 that are provided to select inputs of multiplexer circuits 209, 207, and 203, respectively. During normal transmission operation, multiplexer circuits 209A-209B provide the data indicated by signals INX and INY to PCS/MAC circuits 208A-208B as signals X1 and Y1, respectively. PCS/MAC circuits 208A-208B process the data indicated by signals X1 and Y1 as described above with respect to PCS/MAC circuits 108A-108D to generate signals X2 and Y2, respectively. Multiplexer circuits 207A-207B provide signals X2 and Y2 to gearbox circuits 206A-206B as signals X3 and Y3, respectively.

Gearbox circuits 206A-206B perform processes on the data indicated by signals X3 and Y3 to generate signals X4 and Y4, respectively. FEC logic circuits 205A-205B perform error correction encoding on the data indicated by signals X4 and Y4 to generate encoded data signals X5 and Y5, respectively. Gearbox circuits 206A-206B perform processes on the encoded data indicated by signals X5 and Y5 to generate data signals X6 and Y6, respectively. Multiplexer circuits 203A-203B provide signals X6 and Y6 to SERDES circuits 202A-202B as signals X7 and Y7, respectively. The serializer circuits in SERDES circuits 202A-202B serialize the data bits indicated by the respective signals X7 and Y7 to generate the respective output data signals OUTX and OUTY. The output data signals OUTX and OUTY are transmitted to one or more external devices.

During a dynamic switching mode of operation, only one of the two lanes 101A-101B in transceiver circuit 100 generates an output data signal OUTX or OUTY that indicates data received in only one input data signal INX or INY, respectively. The data provided in the output data signal is dynamically switched between the FEC logic circuits 205A-205B in the two lanes 101A-101B during alternating periods of time in the dynamic switching mode.

For example, the data received in data signal INX may be dynamically switched between FEC logic circuits 205A and 205B during alternating time periods. Thus, two FEC logic circuits 205A-205B in two adjacent lanes 101A-101B perform error correction encoding on the data to be transmitted in one output data signal OUTX during alternating time periods to reduce heat generation and hot spots within each FEC logic circuit 205A-205B. Control circuit 150 toggles the logic states of signals S8-S9 to cause multiplexer circuits 207A-207B and 203A-203B to provide the data indicated by signal X2 through the gearbox and FEC logic circuits in different lanes 101A-101B during alternating time periods to reduce heat generation in the FEC logic circuits 205A-205B.

Thus, when signals S8-S9 are in a first logic state during first time periods, the data indicated by signal X2 is provided through multiplexer circuit 207B and gearbox circuit 206B and then encoded by FEC logic circuit 205B. The encoded data generated by FEC logic circuit 205B is then provided through gearbox circuit 204B and multiplexer circuit 203A to SERDES circuit 202A for serialization as signal OUTX. When signals S8-S9 are in a second logic state during second time periods, the data indicated by signal X2 is provided through multiplexer circuit 207A and gearbox circuit 206A and then encoded by FEC logic circuit 205A. The encoded data generated by FEC logic circuit 205A is then provided through gearbox circuit 204A and multiplexer circuit 203A to SERDES circuit 202A for serialization as signal OUTX. The first and second time periods are interleaved with each other such that the FEC logic circuits 205A-205B encode the data during alternating time periods.

According to another embodiment, the data transmitted in an output data signal is dynamically switched between the PCS/MAC circuits 208A-208B in the transmitter circuits during alternating periods of time to reduce hot spots in the dynamic switching mode. As an example, the data received in data signal INX may be dynamically switched between PCS/MAC circuits 208A-208B during alternating time periods. Multiplexer circuits 209A-209B route the data indicated by signal INX to different ones of the PCS/MAC circuits 208A-208B during alternating time periods. The PCS/MAC circuits 208A-208B process the data indicated by signal INX during the alternating time periods. Multiplexer circuits 207A-207B route the data indicated by either one of signals X2 or Y2 to the respective gearbox circuits 206A-206B.

According to yet another embodiment, heat generation may be statically spread across multiple lanes of a transceiver circuit to reduce hot spots within the transceiver circuit. During static heat spreading, none of the data processing steps are dynamically switched between two different lanes of the transceiver circuit, in contrast with the previous embodiments.

Figure 3:
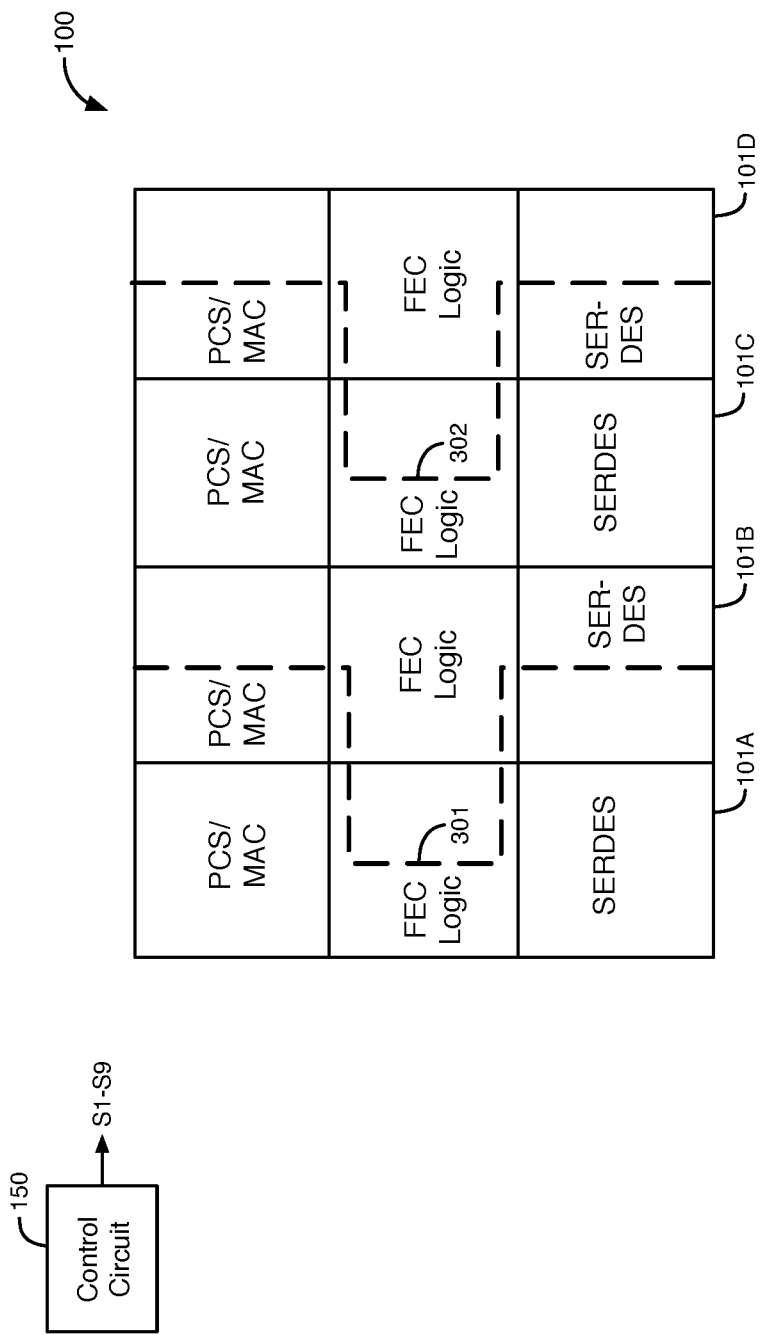
FIG. 3 illustrates an example of static heat spreading to reduce heat generation within a transceiver circuit, according to an embodiment.

FIG. 3 illustrates an example of static heat spreading to reduce heat generation within transceiver circuit 100, according to an embodiment. During a static heat spreading mode of operation, only two of the four lanes 101 in transceiver circuit 100 generate 2 output data signals that indicate data received in only two input data signals.

Static heat spreading may be used to reduce heat generation within transmitter circuits in transceiver circuit 100 and/or within receiver circuits in transceiver circuit 100. In the embodiment of FIG. 3, data received in a first input data signal is processed by the SERDES circuit in lane 101B, the FEC logic circuit in lane 101A, and the PCS/MAC circuit in lane 101B along path 301 to generate a first output data signal. The SERDES circuit in lane 101B, the FEC logic circuit in lane 101A, and the PCS/MAC circuit in lane 101B may be part of a receiver circuit or a transmitter circuit. By processing the data received in the first input data signal partly in lane 101A and partly in lane 101B, heat generation within lane 101B is reduced.

Also, in the embodiment of FIG. 3, data received in a second input data signal is processed by the SERDES circuit in lane 101D, the FEC logic circuit in lane 101C, and the PCS/MAC circuit in lane 101D along path 302 to generate a second output data signal. The SERDES circuit in lane 101D, the FEC logic circuit in lane 101C, and the PCS/MAC circuit in lane 101D may be a receiver circuit or a transmitter circuit. Heat generation within lane 101D is reduced, because the data received in the second input data signal is processed partly in lane 101C and partly in lane 101D.

The examples described above with FEC or PCS/MAC circuitry are provided only as examples. According to various embodiments, other logic circuits associated with a transceiver may also be dynamically switched in a similar manner. As other examples, logic circuits that perform functions for the 802.1AE IEEE MAC Security standard (also referred to as MACsec) or other protocol layers for Ethernet or other data transmission protocols may be dynamically switched between two or more lanes of a transceiver circuit to reduce hot spots, as described above with respect to previous embodiments.

Figure 4:
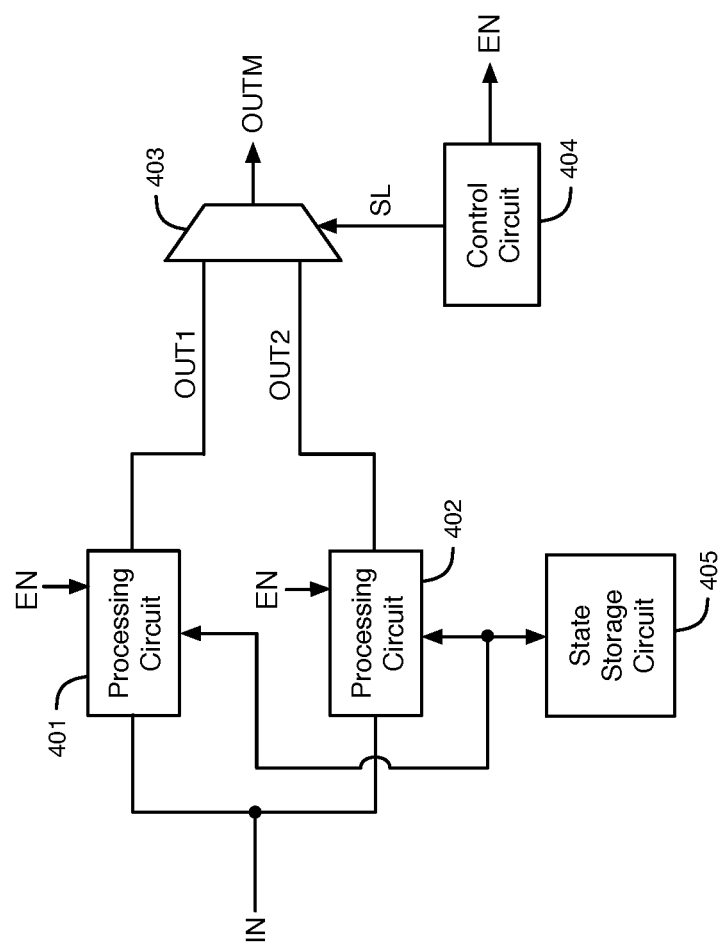
FIG. 4 illustrates an example of dynamic heat spreading between multiple processing circuits to reduce hot spots within an integrated circuit, according to an embodiment.

Other examples of circuitry in an integrated circuit (IC) that may generate local hot spots within the IC include digital signal processing (DSP) circuits, video codec circuits, cyclic redundancy check (CRC) circuits, or other specialized processing circuits. According to another embodiment, heat generation may be dynamically spread across multiple circuits in an IC to reduce hot spots within each circuit. FIG. 4 illustrates an example of dynamic heat spreading between multiple processing circuits to reduce hot spots within an integrated circuit, according to an embodiment. FIG. 4 illustrates two processing circuits 401-402, a multiplexer circuit 403, a control circuit 404, and a state storage circuit 405. Processing circuits 401-402 may be, for example, digital signal processing (DSP) circuits, video encoder circuits, cyclic redundancy check (CRC) circuits, or other specialized processing circuits. If circuits 401-402 are DSP circuits, circuits 401-402 may include circuitry that performs arithmetic functions, such as addition, subtraction, multiplication, and/or division to generate output signals based on input signals. The circuits 401-405 shown in FIG. 4 may all be in the same integrated circuit or in separate integrated circuits. In an exemplary embodiment, multiplexer circuit 403, control circuit 404, and state storage circuit 405 may be part of programmable logic circuitry in a programmable logic IC. The processing circuits 401 and 402 have the same circuit architectures. Processing circuit 402 may have an identical circuit structure as processing circuit 401. Processing circuits 401-402 may be implemented by non-programmable (hardened) logic circuitry.

An input signal IN is provided to a first input of each of processing circuits 401 and 402. An enable signal EN is provided to a second input of each of processing circuits 401 and 402. Control circuit 404 generates the enable signal EN. Control circuit 404 may include, for example, a state machine. Processing circuit 401 generates an output signal OUT1 based on the input signal IN when the enable signal EN is in a first logic state. Processing circuit 402 generates an output signal OUT2 based on the input signal IN when the enable signal EN is in a second logic state.

The output signals OUT1 and OUT2 of the processing circuits 401-402 are provided to multiplexing inputs of multiplexer circuit 403. Control circuit 404 also generates a select signal SL that is provided to a select input of multiplexer circuit 403. Multiplexer circuit 403 provides one of the signals OUT1 or OUT2 to its output as output signal OUTM based on the logic state of the select signal SL, as is now described in further detail.

In the embodiment of FIG. 4, heat generation is dynamically spread between processing circuits 401 and 402 to reduce hot spots within each processing circuit by alternately enabling the processing circuits 401 and 402 during first and second time periods, respectively. Each of the second time periods is interleaved between two of the first time periods, such that the operation of the processing circuits 401-402 periodically alternates between the first and second time periods. During each first time period, control circuit 404 causes each of the enable signal EN and the select signal SL to be in a first logic state. In response to the enable signal EN being in the first logic state, processing circuit 401 generates the output signal OUT1 based on the input signal IN. In response to the select signal SL being in the first logic state, multiplexer circuit 403 provides the output signal OUT1 to its output as output signal OUTM. Also, during each first time period, processing circuit 402 is disabled in response to enable signal EN being in the first logic state. Processing circuit 402 does not generate output signal OUT2, and thus does not generate heat, during each first time period.

During each second time period, control circuit 404 causes each of the enable signal EN and the select signal SL to be in a second logic state. In response to the enable signal EN being in the second logic state, processing circuit 402 generates the output signal OUT2 based on the input signal IN. In response to the select signal SL being in the second logic state, multiplexer circuit 403 provides the output signal OUT2 to its output as output signal OUTM. Also, during each second time period, processing circuit 401 is disabled in response to enable signal EN being in the second logic state. Processing circuit 401 does not generate output signal OUT1, and thus does not generate heat, during each second time period. Control circuit 404 toggles the SL and EN signals between the first and second logic states to spread heat generation between processing circuits 401-402.

State storage circuit 405 stores state information for each of the processing circuits 401 and 402. Processing circuits 401-402 may, for example, have accumulator circuits if circuits 401-402 are DSP circuits. State storage circuit 405 may, for example, store state information for accumulator circuits in processing circuits 401-402. The state information stored in circuit 405 for each accumulator in the processing circuits 401-402 may, for example, include a current sum and carry bits of an addition function performed by the processing circuits 401-402. The state information may be transmitted between the processing circuits 401-402 and the state storage circuit 405 during each respective one of the first and second time periods.

Control circuit 404 may toggle the EN and SL signals in response to a clock signal. In an embodiment, the processing circuits 401 and 402 may be enabled at the same time for a small percentage of each clock cycle after each transition between the first and second time periods to achieve synchronization. In this embodiment, each of the processing circuits 401-402 remains enabled for a short time after the EN signal transitions to the second and first logic states, respectively.

Figure 5:
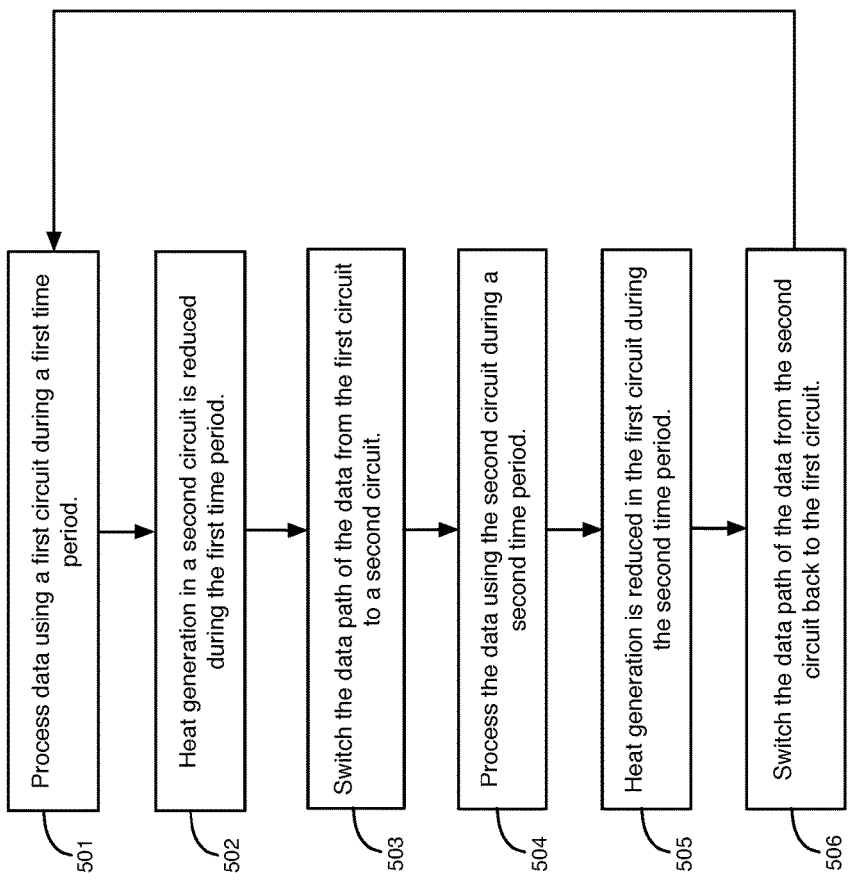
FIG. 5 illustrates examples of operations that may be used to implement a dynamic switching mode between first and second circuits in an integrated circuit to reduce hot spots, according to an embodiment.

FIG. 5 illustrates examples of operations that may be used to implement a dynamic switching mode between first and second circuits in an integrated circuit to reduce hot spots, according to an embodiment. In operation 501, data is processed using the first circuit in the integrated circuit during a first time period. The first circuit may be, for example, the FEC logic circuit in any of lanes 101A-101D, the PCS/MAC circuit in any of lanes 101A-101D, or processing circuit 401. In operation 502, heat generation in the second circuit is reduced during the first time period. The first circuit and the second circuit have the same circuit architectures. The second circuit may be, for example, the FEC logic circuit in a different one of the lanes 101A-101D, the PCS/MAC circuit in a different one of the lanes 101A-101D, or processing circuit 402. Heat generation in the second circuit is reduced, for example, by disabling, turning off, or reducing data processing operations in the second circuit. In operation 503, the data path of the data is switched from the first circuit to the second circuit in the integrated circuit. The data path of the data may be switched from the first circuit to the second circuit in operation 503, for example, using multiplexer circuits 103, 107, and 109 and control circuit 150 as disclosed herein with respect to FIG. 1; using multiplexer circuits 203, 207, and 209 as disclosed herein with respect to FIG. 2; or using multiplexer circuit 403 and control circuit 404, as disclosed herein with respect to FIG. 4.

In operation 504, the data is processed using the second circuit during a second time period. In operation 505, heat generation is reduced in the first circuit during the second time period. Heat generation in the first circuit is reduced, for example, by disabling, turning off, or reducing data processing operations in the first circuit. In operation 506, the data path of the data is switched from the second circuit back to the first circuit. The data path of the data may be switched from the second circuit back to the first circuit in operation 506 using, for example, multiplexer circuits 103, 107, and 109 and control circuit 150; multiplexer circuits 203, 207, and 209 and control circuit 150; or multiplexer circuit 403 and control circuit 404, as described above. After operation 506, the process of FIG. 5 performs operation 501 again. Operations 501-506 may be repeated iteratively numerous times to reduce heat generation, and thus reduce hot spots, within each of the first and second circuits.

The methods and apparatuses described herein may be incorporated into any suitable electronic device or system of electronic devices. For example, the methods and apparatuses may be incorporated into numerous types of devices, such as programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), digital signal processors (DSPs), microprocessors, and graphics processing units (GPUs).

The integrated circuits described herein may be part of a data processing system that includes one or more of the following components; a processor; memory; input/output circuitry; and peripheral devices. The integrated circuits can be used in a wide variety of applications, such as computer networking, data networking, instrumentation, video processing, digital signal processing, or any suitable other application.

Although the method operations were described in a specific order, it should be understood that other operations may be performed in between described operations, described operations may be adjusted so that they occur at slightly different times or in a different order, or described operations may be distributed in a system that allows the occurrence of the operations at various intervals associated with the processing.

The following examples pertain to further embodiments. Example 1 is an integrated circuit comprising: a transceiver circuit, wherein the transceiver circuit comprises a first lane comprising a first processing circuit for processing data indicated by a first data signal during normal operation, and wherein the transceiver circuit further comprises a second lane comprising a second processing circuit for processing data indicated by a second data signal during the normal operation; and a control circuit that causes the data indicated by the first data signal to be alternately routed to the first and second processing circuits at different times during a dynamic switching mode, wherein the first and second processing circuits alternate between processing the data indicated by the first data signal at different times during the dynamic switching mode.

In Example 2, the subject matter of Example 1 can optionally include wherein the first processing circuit comprises a first plurality of elements with state, wherein the second processing circuit comprises a second plurality of elements with state, and wherein in the state of each of the first and second plurality of elements is transferred from one of the first or second processing circuits to the other one of the first or second processing circuits prior to each dynamic switching during the dynamic switching mode.

In Example 3, the subject matter of Example 1 can optionally include wherein the first processing circuit comprises a first plurality of elements with state, wherein the second processing circuit comprises a second plurality of elements with state, and wherein both the first and second processing circuits are kept active only to keep the state of the first and second processing circuits in parallel.

In Example 4, the subject matter of any one of Examples 1-3 can optionally include wherein the first processing circuit comprises a first forward error correction circuit, wherein the second processing circuit comprises a second forward error correction circuit, and wherein the first and second forward error correction circuits alternate between performing error correction functions using the data indicated by the first data signal at different times during the dynamic switching mode to generate processed data.

In Example 5, the subject matter of Example 4 can optionally include wherein the first processing circuit further comprises a first gearbox circuit that identifies frames in data and that is coupled to the first forward error correction circuit, and wherein the second processing circuit further comprises a second gearbox circuit that identifies frames in data and that is coupled to the second forward error correction circuit.

In Example 6, the subject matter of any one of Examples 4-5 can optionally include wherein the first lane further comprises a first multiplexer circuit, wherein the second lane further comprises a second multiplexer circuit, wherein the control circuit causes the first multiplexer circuit to route the data indicated by the first data signal to the first forward error correction circuit during first time periods during the dynamic switching mode, wherein the control circuit causes the second multiplexer circuit to route the data indicated by the first data signal to the second forward error correction circuit during second time periods during the dynamic switching mode, and wherein the first time periods are interleaved between the second time periods.

In Example 7, the subject matter of any one of Examples 1-6 can optionally include wherein the first processing circuit comprises a first logic circuit that performs functions for a physical coding sublayer or a media access control sublayer on data, wherein the second processing circuit comprises a second logic circuit that performs functions for the physical coding sublayer or the media access control sublayer on data, and wherein the first and second logic circuits alternate between processing the data indicated by the first data signal at different times during the dynamic switching mode.

In Example 8, the subject matter of any one of Examples 1-7 can optionally include wherein the first lane comprises a first receiver circuit that comprises the first processing circuit, wherein the second lane comprises a second receiver circuit that comprises the second processing circuit, and wherein the first receiver circuit receives the first data signal from outside the integrated circuit.

In Example 9, the subject matter of any one of Examples 1-8 can optionally include wherein the first lane comprises a first transmitter circuit that comprises the first processing circuit, wherein the second lane comprises a second transmitter circuit that comprises the second processing circuit, and wherein the first transmitter circuit generates a third data signal for transmission outside the integrated circuit during the dynamic switching mode.

In Example 10, the subject matter of any one of Examples 1-9 can optionally include wherein the first lane further comprises a first multiplexer circuit, wherein the second lane further comprises a second multiplexer circuit, wherein the control circuit causes the first multiplexer circuit to route the data indicated by the first data signal to the first processing circuit during first time periods during the dynamic switching mode, wherein the control circuit causes the second multiplexer circuit to route the data indicated by the first data signal to the second processing circuit during second time periods during the dynamic switching mode, and wherein the first time periods are interleaved between the second time periods.

In Example 11, the subject matter of any one of Examples 1-10 can optionally include wherein the first processing circuit generates less heat during the dynamic switching mode than during the normal mode, wherein the second processing circuit generates less heat during the dynamic switching mode than during the normal mode, and wherein the first and second processing circuits have the same circuit architecture.

Example 12 is a circuit system comprising: a first processing circuit; a second processing circuit; a multiplexer circuit coupled to the first and second processing circuits; and a control circuit that causes the first and second processing circuits to switch dynamically between processing data indicated by a data signal at different and alternating times during a dynamic switching mode, wherein the control circuit causes the multiplexer circuit to provide output signals of the first and second processing circuits as an output signal of the multiplexer circuit at different and alternating times, and wherein the first processing circuit has the same circuit architecture as the second processing circuit.

In Example 13, the subject matter of Example 12 can optionally include a state storage circuit that stores state information for each of the first and second processing circuits.

In Example 14, the subject matter of Example 13 can optionally include wherein the first and second processing circuits are digital signal processing circuits that perform arithmetic functions using accumulator circuits, and wherein the state storage circuit stores state information for the accumulator circuits in the first and second processing circuits.

In Example 15, the subject matter of any one of Examples 12-14 can optionally include wherein the control circuit enables the first processing circuit to process the data and disables the second processing circuit from processing the data during first time periods, wherein the control circuit enables the second processing circuit to process the data and disables the first processing circuit from processing the data during second time periods, and wherein the first time periods alternate with the second time periods.

Example 16 is a method for reducing hot spots in circuits, the method comprising: processing data using a first circuit during a first time period; reducing heat generation in a second circuit during the first time period, wherein the first circuit and the second circuit have the same circuit architectures; switching a data path of the data from the first circuit to the second circuit; processing the data using the second circuit during a second time period after the first time period; reducing heat generation in the first circuit during the second time period; switching the data path of the data from the second circuit to the first circuit; and processing the data using the first circuit during a third time period after the second time period.

In Example 17, the subject matter of Example 16 can optionally include: reducing heat generation in the second circuit during the third time period; switching the data path of the data from the first circuit to the second circuit; processing the data using the second circuit during a fourth time period after the third time period; and reducing heat generation in the first circuit during the fourth time period.

In Example 18, the subject matter of any one of Examples 16-17 can optionally include wherein processing the data using the first circuit during the first time period comprises performing an error correction function on the data during the first time period using a first forward error correction circuit, wherein processing the data using the second circuit during the second time period comprises performing the error correction function on the data during the second time period using a second forward error correction circuit, and wherein the first and second forward error correction circuits alternate between performing the error correction function on the data at different times during a dynamic switching mode.

In Example 19, the subject matter of any one of Examples 16-18 can optionally include wherein processing the data using the first circuit during the first time period comprises performing functions for a physical coding sublayer or a media access control sublayer on the data using the first circuit, wherein processing the data using the second circuit during the second time period comprises performing functions for the physical coding sublayer or the media access control sublayer on the data using the second circuit, and wherein the first and second circuits alternate between processing the data at different times during a dynamic switching mode.

In Example 20, the subject matter of any one of Examples 16-19 can optionally include wherein processing the data using the first circuit during the first time period comprises performing an arithmetic function on the data during the first time period using a first digital signal processing circuit, wherein processing the data using the second circuit during the second time period comprises performing the arithmetic function on the data during the second time period using a second digital signal processing circuit, and wherein the first and second digital signal processing circuits alternate between performing the arithmetic function on the data at different times during a dynamic switching mode.

Example 21 is an integrated circuit comprising: first means for processing data indicated by a first data signal during normal operation in a first lane of a transceiver circuit; second means for processing data indicated by a second data signal during the normal operation in a second lane of the transceiver circuit; and means for causing the data indicated by the first data signal to be alternately routed to the first and second means for processing data at different times during a dynamic switching mode, wherein the first and second means for processing data alternate between processing the data indicated by the first data signal at different times during the dynamic switching mode.

In Example 22, the subject matter of Example 21 can optionally include wherein the first means for processing data comprises a first forward error correction circuit, wherein the second means for processing data comprises a second forward error correction circuit, and wherein the first and second forward error correction circuits alternate between performing error correction functions using the data indicated by the first data signal at different times during the dynamic switching mode.

In Example 23, the subject matter of any one of Examples 21-22 can optionally include wherein the first means for processing data comprises a first logic circuit that performs functions for a physical coding sublayer or a media access control sublayer on data, wherein the second means for processing data comprises a second logic circuit that performs functions for the physical coding sublayer or the media access control sublayer on data, and wherein the first and second logic circuits alternate between processing the data indicated by the first data signal at different times during the dynamic switching mode.

In Example 24, the subject matter of any one of Examples 21-23 can optionally include wherein the first lane comprises a first multiplexer circuit, wherein the second lane comprises a second multiplexer circuit, wherein the control circuit causes the first multiplexer circuit to route the data indicated by the first data signal to the first means for processing data during first time periods during the dynamic switching mode, wherein the control circuit causes the second multiplexer circuit to route the data indicated by the first data signal to the second means for processing data during second time periods during the dynamic switching mode, and wherein the first time periods are interleaved between the second time periods.

In Example 25, the subject matter of any one of Examples 21-24 can optionally include wherein the first means for processing data generates less heat during the dynamic switching mode than during the normal mode, and wherein the second means for processing data generates less heat during the dynamic switching mode than during the normal mode.

In Example 26, the subject matter of any one of Examples 21-25 can optionally include wherein the first lane comprises a first receiver circuit that comprises the first means for processing data, wherein the second lane comprises a second receiver circuit that comprises the second means for processing data, and wherein the first receiver circuit receives the first data signal from outside the integrated circuit.

In Example 27, the subject matter of any one of Examples 21-26 can optionally include wherein the first lane comprises a first transmitter circuit that comprises the first means for processing data, wherein the second lane comprises a second transmitter circuit that comprises the second means for processing data, and wherein the first transmitter circuit generates a third data signal for transmission outside the integrated circuit during the dynamic switching mode.

In Example 28, the subject matter of any one of Examples 21-27 can optionally include wherein the first means for processing data maintains synchronization with the data when the first means for processing data is not being used to process data by receiving a synchronization state from the second means for processing data.

In Example 29, the subject matter of any one of Examples 21-28 can optionally include wherein the second means for processing data maintains synchronization with the data when the second means for processing data is not being used to process data by receiving a synchronization state from the first means for processing data.

In Example 30, the subject matter of any one of Examples 21-29 can optionally include wherein the first and second processing circuits have the same circuit architecture.

In Example 31, the subject matter of any one of Examples 21-30 can optionally include wherein the means for causing the data only causes the data indicated by the first data signal to be routed to a different one of the first or second means for processing data in between packets of the data.

In Example 32, the subject matter of any one of Examples 21-22 can optionally include wherein the means for causing the data only causes the data indicated by the first data signal to be routed to a different one of the first or second means for processing data in between forward error correction blocks of the data.

All optional features of the integrated circuits described above may also be implemented with respect to the methods or processes described herein. Specifics in the examples may be used anywhere in one or more embodiments.

The foregoing description of the exemplary embodiments of the present invention has been presented for the purpose of illustration. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. An integrated circuit comprising:
a transceiver circuit, wherein the transceiver circuit comprises a first lane comprising a first processing circuit for processing first data indicated by a first data signal that is received at the first lane during normal operation, and wherein the transceiver circuit further comprises a second lane comprising a second processing circuit for processing second data indicated by a second data signal that is received at the second lane during the normal operation; and
a control circuit that causes the first data indicated by the first data signal to be dynamically switched between the first and second processing circuits during alternating periods of time during a dynamic switching mode, wherein the first and second processing circuits alternate between processing the first data indicated by the first data signal during the alternating periods of time during the dynamic switching mode to reduce heat generation within the first and second lanes.

2. The integrated circuit of claim 1, wherein the first processing circuit comprises a first plurality of elements with state, wherein the second processing circuit comprises a second plurality of elements with state, and wherein the state of each of the first and second plurality of elements is transferred from one of the first or second processing circuits to the other one of the first or second processing circuits prior to each dynamic switching during the dynamic switching mode.

3. The integrated circuit of claim 1, wherein the first processing circuit comprises a first plurality of elements with state, wherein the second processing circuit comprises a second plurality of elements with state, and wherein both the first and second processing circuits are kept active only to keep the state of the first and second processing circuits in parallel.

4. The integrated circuit of claim 2, wherein the first processing circuit comprises a first forward error correction circuit, wherein the second processing circuit comprises a second forward error correction circuit, and wherein the first and second forward error correction circuits alternate between performing error correction functions using the first data indicated by the first data signal during the alternating periods of time during the dynamic switching mode to generate processed data.

5. The integrated circuit of claim 4, wherein the first processing circuit further comprises a first gearbox circuit that identifies frames in data and that is coupled to the first forward error correction circuit, and wherein the second processing circuit further comprises a second gearbox circuit that identifies frames in data and that is coupled to the second forward error correction circuit.

6. The integrated circuit of claim 4, wherein the first lane further comprises a first multiplexer circuit, wherein the second lane further comprises a second multiplexer circuit, wherein the control circuit causes the first multiplexer circuit to route the first data indicated by the first data signal to the first forward error correction circuit during first time periods during the dynamic switching mode, wherein the control circuit causes the second multiplexer circuit to route the first data indicated by the first data signal to the second forward error correction circuit during second time periods during the dynamic switching mode, and wherein the first time periods are interleaved between the second time periods.

7. The integrated circuit of claim 1, wherein the first processing circuit comprises a first logic circuit that performs functions for a physical coding sublayer or a media access control sublayer on data, wherein the second processing circuit comprises a second logic circuit that performs functions for the physical coding sublayer or the media access control sublayer on data, and wherein the first and second logic circuits alternate between processing the first data indicated by the first data signal during the alternating periods of time during the dynamic switching mode.

8. The integrated circuit of claim 1, wherein the first lane comprises a first receiver circuit that comprises the first processing circuit, wherein the second lane comprises a second receiver circuit that comprises the second processing circuit, and wherein the first receiver circuit receives the first data signal from outside the integrated circuit.

9. The integrated circuit of claim 1, wherein the first lane comprises a first transmitter circuit that comprises the first processing circuit, wherein the second lane comprises a second transmitter circuit that comprises the second processing circuit, and wherein the first transmitter circuit generates a third data signal for transmission outside the integrated circuit during the dynamic switching mode.

10. The integrated circuit of claim 1, wherein the first lane further comprises a first multiplexer circuit, wherein the second lane further comprises a second multiplexer circuit, wherein the control circuit causes the first multiplexer circuit to route the first data indicated by the first data signal to the first processing circuit during first time periods during the dynamic switching mode, wherein the control circuit causes the second multiplexer circuit to route the first data indicated by the first data signal to the second processing circuit during second time periods during the dynamic switching mode, and wherein the first time periods are interleaved between the second time periods.

11. The integrated circuit of claim 1, wherein the first processing circuit generates less heat during the dynamic switching mode than during the normal operation as a result of the first processing circuit being dormant during first periods of time, wherein the second processing circuit generates less heat during the dynamic switching mode than during the normal operation as a result of the second processing circuit being dormant during second periods of time, wherein each of the second periods of time is interleaved between two of the first periods of time, and wherein the first and second processing circuits have the same circuit architecture.

12. A circuit system comprising:
a first processing circuit;
a second processing circuit;
a multiplexer circuit coupled to the first and second processing circuits; and
a control circuit that causes the first and second processing circuits to switch dynamically between processing data indicated by a data signal at different and alternating times during a dynamic switching mode, wherein the control circuit causes the multiplexer circuit to provide output signals of the first and second processing circuits as an output signal of the multiplexer circuit at different and alternating times, and wherein the first processing circuit has the same circuit architecture as the second processing circuit.

13. The circuit system of claim 12 further comprising:
a state storage circuit that stores state information for each of the first and second processing circuits.

14. The circuit system of claim 13, wherein the first and second processing circuits are digital signal processing circuits that perform arithmetic functions using accumulator circuits, and wherein the state storage circuit stores state information for the accumulator circuits in the first and second processing circuits.

15. The circuit system of claim 12, wherein the control circuit enables the first processing circuit to process the data and disables the second processing circuit from processing the data during first time periods, wherein the control circuit enables the second processing circuit to process the data and disables the first processing circuit from processing the data during second time periods, and wherein the first time periods alternate with the second time periods.

16. A method for reducing hot spots in circuits, the method comprising:
processing data using a first circuit during a first time period;
reducing heat generation in a second circuit during the first time period, wherein the first circuit and the second circuit have the same circuit architecture;
switching a data path of the data from the first circuit to the second circuit;
processing the data using the second circuit during a second time period after the first time period;
reducing heat generation in the first circuit during the second time period;
switching the data path of the data from the second circuit to the first circuit; and
processing the data using the first circuit during a third time period after the second time period.

17. The method of claim 16 further comprising:
reducing heat generation in the second circuit during the third time period;
switching the data path of the data from the first circuit to the second circuit;
processing the data using the second circuit during a fourth time period after the third time period; and
reducing heat generation in the first circuit during the fourth time period.

18. The method of claim 16, wherein processing the data using the first circuit during the first time period comprises performing an error correction function on the data during the first time period using a first forward error correction circuit,
wherein processing the data using the second circuit during the second time period comprises performing the error correction function on the data during the second time period using a second forward error correction circuit, and wherein the first and second forward error correction circuits alternate between performing the error correction function on the data at different times during a dynamic switching mode.

19. The method of claim 16, wherein processing the data using the first circuit during the first time period comprises performing functions for a physical coding sublayer or a media access control sublayer on the data using the first circuit,
wherein processing the data using the second circuit during the second time period comprises performing functions for the physical coding sublayer or the media access control sublayer on the data using the second circuit, and wherein the first and second circuits alternate between processing the data at different times during a dynamic switching mode.

20. The method of claim 16, wherein processing the data using the first circuit during the first time period comprises performing an arithmetic function on the data during the first time period using a first digital signal processing circuit,
wherein processing the data using the second circuit during the second time period comprises performing the arithmetic function on the data during the second time period using a second digital signal processing circuit, and wherein the first and second digital signal processing circuits alternate between performing the arithmetic function on the data at different times during a dynamic switching mode.

* * * * *